United States Patent [19]
Tzinis et al.

[11] Patent Number: 4,550,074
[45] Date of Patent: Oct. 29, 1985

[54] SENSITIZING BATH FOR CHALCOGENIDE RESISTS

[75] Inventors: Costas H. Tzinis, Bridgewater; Richard G. Vadimsky, Somerville, both of N.J.

[73] Assignee: AT&T Bell Laboratories, Murray Hill, N.J.

[21] Appl. No.: 699,481

[22] Filed: Feb. 5, 1985

Related U.S. Application Data

[63] Continuation of Ser. No. 492,434, May 6, 1983, abandoned.

[51] Int. Cl.$^4$ .............................................. G03C 5/24
[52] U.S. Cl. ................................. 430/322; 430/323; 430/311; 430/313; 430/495
[58] Field of Search ............... 430/322, 323, 311, 313, 430/495, 564, 422

[56] References Cited

U.S. PATENT DOCUMENTS 4,276,368 6/1981 Heller et al. .................. 430/313
4,286,045 8/1981 Nahara et al. ................. 430/495

Primary Examiner—Won H. Louie
Attorney, Agent, or Firm—Bernard Tiegerman

[57] ABSTRACT

The invention involves a new sensitizing bath for chalcogenide glass-based resists. The inventive bath is alkaline and contains a silver complex whose ligand includes hydrophobic and hydrophilic moieties. Upon immersing a chalcogenide glass in the bath, a silver composition-containing film is formed on the surface of the glass. This film is substantially free of pin holes and has a uniform thickness which is insensitive to immersion time and largely determined by the pH of the bath.

23 Claims, No Drawings

SENSITIZING BATH FOR CHALCOGENIDE RESISTS

This application is a continuation of application Ser. No. 492,434 filed May 6, 1983 abandoned.

BACKGROUND OF THE INVENTION

1. Field of the Invention

The invention pertains generally to lithographic processes for producing devices such as, e.g., semiconductor devices and, more particularly, to sensitizing baths for chalcogenide resists.

2. Art Background

Lithographic processes play an important role in the manufacture of devices such as, e.g., semiconductor devices. During the manufacture of these devices, lithographic processes are used to pattern substrates, such as silicon wafers or processed silicon wafers which are, for example, wholly or partially covered by metal, silicon dioxide, or polysilicon. That is, a substrate is coated with an energy sensitive material called a resist. Selected portions of the resist are exposed to a form of energy which induces a change in the solubility of the exposed portions in relation to a given developing agent or etchant. The more soluble portions of the resist are removed and portions of the substrate are bared by applying the developing agent or etchant to the resist. The bared portions of the substrate are then treated, e.g., are etched or metallized.

Both organic and inorganic materials have been used as resists for the patterning of substrates. Exemplary inorganic materials are chalcogenide glass based materials, i.e., materials exhibiting a noncrystalline structure and whose major constituent is sulfur, selenium, or tellurium, or compounds thereof. Included among the chalcogenide glass based materials used as resists are germanium-selenium (Ge-Se) glass layers supporting relatively thin layers of silver selenide ($Ag_2Se$). Typically, a Ge-Se glass layer is evaporated or rf-sputtered onto the surface of a substrate. A thin layer of $Ag_2Se$ is formed on the surface of the Ge-Se glass by, for example, dipping the glass into a $Ag^+$-containing aqueous solution, or a $[Ag(CN)_2]^-$-containing aqueous solution, the resulting chemical reactions with the glass yielding the $Ag_2Se$.

When an $Ag_2Se$-covered Ge-Se glass is exposed to an appropriate form of energy, silver ions from the $Ag_2Se$ migrate into the exposed regions of the Ge-Se glass, decreasing the solubility of these regions to specific developers. This migration of silver ions, which is referred to as silver photodoping, is induced, for example, by UV light (in the wavelength range from about 2000 to about 4500 Angstroms), low energy electron beams (having energies ranging from about 1 keV to about 3 keV), and low energy ion beams (including ions such as helium, nitrogen, argon, xenon, and gallium ions with energies ranging from about 10 keV to about 30 keV). It is believed that silver photodoping involves electron-hole pair generation within the Ge-Se through, for example, the absorption of photons. The electric field produced by the electron-hole pair generation accelerates the diffusion of silver ions downwardly from the $Ag_2Se$ layer into the Ge-Se, with the holes moving upwardly from the Ge-Se into the $Ag_2Se$ to provide charge compensation.

After a Ge-Se resist is exposed to energy, the Se and $Ag_2Se$ remaining on the surface of the resist is removed. This is done, for example, by immersion in a $KI-I_2$ solution which dissolves, i.e., oxidizes, the $Ag_2Se$ and Se to form $SeO_3^{2-}$ and $AgI_4^{3-}$. Thereafter, the Ge-Se film is either dry developed, or wet developed. (See, for example, R. G. Vadimsky, K. L. Tai, Abstract No. 318, 158th Electrochemical Society Meeting, Hollywood, Fla., October 5–10, 1980, regarding wet development of Ge-Se resists).

One of the advantages of Ge-Se resists in their high absorption cross-section for various forms of energy, including UV light, low-energy electron beams, and low-energy ion beams. For example, at least 60 percent of UV light, when incident on Ge-Se resists, is absorbed within a thin image layer about 100 to 300 Angstroms (Å) thick. Consequently, good line width control (variations in line width are less than or equal to about 10 percent for linewidths of, for example, 1 $\mu$m) is achieved with Ge-Se resists because little or no UV light penetrates beyond the thin image layer, and thus reflections from the substrates supporting the Ge-Se resists, with their attendant degradation in line width control, are avoided.

Another advantage of Ge-Se resists is their ability to resolve feature sizes smaller than 1 $\mu$m while simultaneously achieving good line width control. It is believed that these properties are due to the so-called edge-sharpening effect. (Tai et al, Abstract No. 319, 158th Electrochemical Society Meeting, Hollywood, Fla., Oct. 5–10, 1980; and Tai et al, "Submicron Optical Lithography Using an Inorganic Resist-Polymer Bi-level Scheme," *Journal of Vacuum Science Technology*, 17(5), September-October 1980, pages 1169–1175, have explained this desirable effect).

While Ge-Se resists do exhibit the advantageous properties described above, their lithographic performance is critically dependent on the thickness, thickness uniformity, and morphology of the overlying $Ag_2Se$ films. For example, the thickness of an $Ag_2Se$ layer should be greater than about 50 Å but less than about 150 Å, and should preferably be about 100 Å. A thickness less than about 50 Å is undesirable because such a film contains an inadequate amount of silver to adequately silver photodope the underlying Ge-Se glass. On the other hand, a thickness greater than about 150 Å is undesirable because such a layer of $Ag_2Se$ absorbs so much incident radiation that relatively few electron-hole pairs are formed within the Ge-Se glass, again resulting in an inadequate silver photodoping of the Ge-Se.

Not only should the $Ag_2Se$ layer have a thickness ranging from about 50 to about 150 Å, but the thickness of the $Ag_2Se$ layer should be substantially uniform (variations in thickness should be less than about 5 percent of the average thickness). Significant variations in thickness (more than about 5 percent) result in undesirably large variations in the amount of silver photodoped into the Ge-Se glass, producing degraded linewidth control.

Finally, the $Ag_2Se$ layer should have relatively few pinholes (fewer than about 20/$\mu m^2$) and the pinholes, if present, should be relatively small (should have diameters smaller than about 0.05 $\mu$m). A large number of pinholes (more than about 20/$\mu m^2$) and/or pinholes which are relatively large (having diameters larger than about 0.05 $\mu$m), results in undesirably large variations in the amount of silver photodoped into the underlying Ge-Se glass.

In order to be useful in a production environment, the Ge-Se resists must exhibit reproducibly good lithographic performance. Thus, the sensitizing baths must not only yield $Ag_2Se$ layers whose thicknesses range from about 50 to about 150 Å, but whose thicknesses are uniform (any variations in the thickness of an $Ag_2Se$ layer should be less than about 5 percent of the average thickness), reproducible (the difference between the average thickness of any $Ag_2Se$ layer and the desired thickness should be less than about 5 percent of the desired thickness), and have relatively few pinholes (fewer than about $20/\mu m^2$) of relatively small size (having diameters smaller than about 0.05 $\mu m$). Moreover, such $Ag_2Se$ layers should be formed in less than about 20 minutes, in order for the baths to be economical.

While the $Ag^+$-containing aqueous baths, and the $[Ag(CN)_2]^-$-containing aqueous baths, do produce useful $Ag_2Se$ layers, the latter baths are toxic and exhibit significant dip time sensitivity, i.e., small differences in dip time result in undesirably large differences in the thicknesses of the $Ag_2Se$ layers (a difference in dip time of, for example, 10 percent yields a thickness difference greater than about 5 percent). In addition, both the former and latter baths intermittently produce $Ag_2Se$ layers whose thicknesses are non-uniform (the layers exhibit thickness variations greater than about 5 percent of the average thickness). Finally, both the former and latter baths often yield $Ag_2Se$ layers having an undesirably large number of pinholes (more than about $20/\mu m^2$) and/or undesirably large pinholes (having diameters larger than about 0.05 $\mu m$). (The addition of excess $CN^-$ ions to the $[Ag(CN)_2]^-$-containing aqeuous baths, as described in U.S. Pat. No. 4,343,887 issued to Heller et al on Aug. 10, 1982, does, however, significantly improve the performance of the $[Ag(CN)_2]^-$-containing baths.)

Thus, those involved in the development of chalcogenide resists have long sought, thus far without success, nontoxic sensitizing baths which yield silver composition-containing layers, e.g., $Ag_2Se$ layers, whose thicknesses are substantially uniform (any variation in the thickness of a $Ag_2Se$ layer is less than about 5 percent of the average thickness), insensitive to dip time (a difference in dip time of about 10 percent yields a thickness difference less than about 5 percent), and which have relatively few pinholes (fewer than about $20/\mu m^2$) of relatively small size (having diameters smaller than about 0.05 $\mu m$).

SUMMARY OF THE INVENTION

The invention involves a new, nontoxic sensitizing bath which yields silver composition-containing films on the surface of glasses immersed in the bath. The silver composition-containing films have few pinholes (fewer than about $20/\mu m^2$) of relatively small size (their diameters are smaller than about 0.05 $\mu m$) and have thicknesses which are substantially uniform (thickness variations are smaller than about 5 percent of the average thickness) and relatively insensitive to dip time (a difference in dip time of 10 percent yields a thickness difference less than about 5 percent). The bath is aqueous and contains a silver complex which includes a ligand having both hydrophobic and hydrophilic moieties. Both the ligand and the silver complex are soluble in the bath, and the bath is alkaline, preferably having a pH ranging from about 9 to about 13. It is the pH of the bath which largely determines the thickness of the silver composition-containing films.

DETAILED DESCRIPTION

The invention is a method for fabricating devices, such as, e.g., semiconductor or magnetic bubble devices, which involves the use of chalcogenide glass resists. In accordance with the invention, a chalcogenide glass layer, which typically has a thickness of about 2000 Å, is deposited onto a substrate by conventional techniques, such as evaporation or rf-sputtering. The substrate is, for example, a processed or unprocessed silicon wafer. The substrate also includes, for example, a planarizing layer of organic resist, such as a layer of PMMA (poly(methyl methacrylate)), which presents a generally flat, planar surface onto which the chalcogenide glass is deposited.

After being deposited onto the substrate, the chalcogenide glass is dipped for a period of time ranging from about 1 to about 10 minutes into an inventive sensitizing bath, resulting in the formation of a silver composition-containing film on the surface of the glass. The thickness of the silver composition-containing film ranges from about 50 Å to about 150 Å, and is preferably about 100 Å. Dip times smaller than about 1 minute are undesirable because they produce silver composition-containing films whose thicknesses are less than about 50 Å, while dip times greater than about 10 minutes produce no significant increase in thickness, the thickness being primarily determined by the pH of the bath.

Like prior sensitizing baths, the inventive sensitizing bath is aqueous and contains a silver complex which includes a ligand bound to a silver ion. But unlike prior baths, the ligand (a molecule) includes at least two moieties (each moiety comprising one or more atoms), one of the moieties being hydrophobic and the other moiety being hydrophilic. (By way of contrast, the $CN^-$ ion, the ligand employed in the $[Ag(CN)_2]^{-1}$-containing aqueous sensitizing baths, is only hydrophilic.) Such hydrophobic-hydrophilic ligands are typically organic compounds. It is believed that the hydrophobic-hydrophilic nature of the ligand is responsible, at least in part, for the fact that the inventive sensitizing bath produces silver composition-containing films having relatively few (fewer than about $20/\mu m^2$) pinholes of relatively small size (having diameters smaller than about 0.05 $\mu m$). By contrast, sensitizing baths containing silver complexes whose ligands are, for example, only hydrophilic may result in silver composition-containing films having undesirably many pinholes (more than about $20/\mu m^2$) of relatively large size (having diameters larger than about 0.05 $\mu m$).

While not essential to the invention, the ligand employed in the inventive bath is preferably a multidentate i.e., the ligand is attached to the silver ion at more than one binding site. This is advantageous because the resulting silver complex is less likely (than unidentate ligands) to be decomplexed to produce silver ions which might react with other constituents of the bath to produce silver precipitates. Such silver precipitates are undesirable because they lead to defects (local nonhomogeneities which locally prevent photodiffusion) in the silver composition-containing film. Ligands which include both hydrophobic and hydrophilic moieties, and which are also, for example, multidentate, include, for example, ethylenediamine, 1,2 propanediamine, 1,3 propanediamine, 1,4 butanediamine, $\beta$-alanine, glycine, 2-aminomethylpyroidine, and pyrrolidine-2,5 dione. In the case of ethylenediamine, for example, the methylene groups of this compound are hydrophobic, the two amino groups are hydrophilic, and chemical bonds are formed between a silver ion and the two amino groups of the ethylenediamine.

Ligands encompassed by the invention are complexed with silver ions by, for example, adding a silver salt, e.g., AgNO$_3$, to the inventive bath along with the desired ligand. The ratio of the number of moles of ligand to the number of moles of silver salt should be greater than about 1:1. Ratios smaller than about 1:1 are undesirable because they lead to undesirable precipitates which produce defects in the silver-composition containing films. Moreover, the resulting concentration of the silver complex in the bath should range from about 0.001 M to about 0.5M. Concentrations of at least 0.001 M are needed in order to produce silver composition-containing films having thicknesses of at least 50 Å in commercially reasonable periods of time (smaller than about 20 minutes, and typically about 1 to about 10 minutes). Concentrations greater than about 0.5M are undesirable because they result in gross defects in the silver composition-containing layer.

The thickness of the silver composition-containing film formed on the surface of a chalcogenide glass immersed in the inventive bath is largely determined by the pH of the bath provided the dip time is at least 1 minute, and preferably at least 5 minutes. The bath should be alkaline, and preferably have a pH ranging from about 9 to about 13. Acidic baths are undesirable because they lead to precipitates which result in defects in the silver composition-containing layer. Moreover, a pH less than about 9 is undesirable because the resulting silver composition-containing layer will have a thickness less than about 50 Å and, moreover, will have an undesirably large number of pinholes. A pH greater than about 13, on the other hand, is undesirable because so great a concentration of OH$^-$ tends to dissolve the chalcogenide glasses. A pH between 9 and 13 yields a silver composition-containing film having a thickness ranging from about 50 to about 150 Å. In general, in order to determine the pH level needed to produce a desired thickness of the silver composition-containing film to be formed on the surface of a chalcogenide glass, control samples of the chalcogenide glass are dipped, for at least b 1 minute, into control samples of the inventive bath, having different pH levels.

It should be noted that the hydrophobic-hydrophilic ligands employed in the inventive bath tend to be natural buffers which modify the pH of the bath. To achieve a desired pH (ranging from about 9 to about 13) a base, e.g., NaOH or KOH, or a buffer, e.g., sodium carbonate-sodium bicarbonate, is added to the bath.

In addition to the above properties, and in order to avoid the precipitation of various compounds which form defects in the silver composition-containing film, the bath is preferably at least 50 percent aqueous (by volume) and both the ligand and the silver complex are soluble in the bath. For purposes of the invention, a constituent of the bath is soluble in the bath provided mixing the constituent into the bath at concentrations up to 0.3 M yields no visually observable precipitates.

As a pedagogic aid to a more complete understanding of the invention, a hypothetical explanation of how the inventive bath operates to yield reproducibly uniform, substantially pinhole-free Ag$_2$Se resists on Ge-Se glasses is described below.

Preferably, the Ge-Se resists have the composition Ge$_x$Se$_{1-x}$ where $x > \frac{1}{3}$. It is believed that the chemistry of Ge$_x$Se$_{1-x}$ films, with $x < \frac{1}{3}$, is just the superposition of the chemistries of GeSe$_2$ and Se. Thus, when Ge$_x$Se$_{1-x}$ glasses, with $x < \frac{1}{3}$, are dipped into the inventive bath, containing, for example, silver complexed with ethylenediamine (ED), then the following reactions are believed to occur:

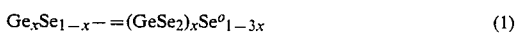
$$Ge_xSe_{1-x} = (GeSe_2)_xSe^0{}_{1-3x} \tag{1}$$

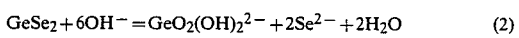
$$GeSe_2 + 6OH^- = GeO_2(OH)_2{}^{2-} + 2Se^{2-} + 2H_2O \tag{2}$$

$$Se^{2-} + 2Ag(ED)^+ = Ag_2Se + 2ED \tag{3}$$

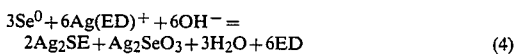
$$3Se^0 + 6Ag(ED)^+ + 6OH^- =$$
$$2Ag_2SE + Ag_2SeO_3 + 3H_2O + 6ED \tag{4}$$

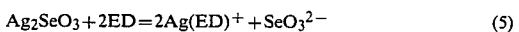
$$Ag_2SeO_3 + 2ED = 2Ag(ED)^+ + SeO_3{}^{2-} \tag{5}$$

That is, the hydroxyl ions react with the Ge$_x$Se$_{1-x}$ (see (1) and (2), above) to form Se$^{2-}$ ions as well as Se$^0$. The Se$^{2-}$ ions then react with the silver complex (see (3), above) to form Ag$_2$Se, and the Se$^0$ undergoes a disproportionation reaction (see (4), above) to form Ag$_2$Se (silver selenide) and Ag$_2$SeO$_3$ (silver selenite). The Ag$_2$SeO$_3$ is soluble in the bath (see (5), above) and if both the Ag$_2$Se and the Ag$_2$SeO$_3$ were simultaneously precipitated onto the surface of the Ge$_x$Se$_{1-x}$ ($x < \frac{1}{3}$) glass, then the subsequent dissolution of the Ag$_2$SeO$_3$ (see (5), above) would leave a Ag$_2$Se layer having a substantial number of pinholes. However, it is believed that the ligands encompassed by the invention prevent this from happening because the ligands enable the Ag$_2$SeO$_3$ to dissolve before the precipitation of the Ag$_2$Se.

To understand the function of the ligands employed in the present invention, it must first be noted that prior sensitizing baths often produced an ionic mismatch between the bath and the surface of the chalcogenide glass. That is, there was little or no wetting of the surface of the chalcogenide glass because chalcogenide compounds are typically covalent in character and thus hydrophobic, whereas the ligands employed in the prior baths are typically ionic in character, and thus hydrophilic. In contrast, the ligands employed in the inventive bath have at least one hydrophobic moiety and at least one hydrophilic moiety. For example, the methylene groups included in ethylenediamine (one of the ligands encompassed by the invention) are hydrophobic, whereas the amino groups are hydrophilic. During the formation of an initial seeding layer of Ag$_2$Se, having a thickness of about 20-25 Å, on the surface of the Ge$_x$Se$_{1-x}$ ($x < \frac{1}{3}$) glass, it is believed that the atoms of the hydrophobic moiety of the ligand employed in the invention form weak chemical bonds with the hydrophobic surface of the Ge$_x$Se$_{1-x}$ ($x < \frac{1}{3}$) glass. Thus, the hydrophilic moiety of the ligand is exposed to the bath. It is believed that the resulting hydrophilicity of the modified glass surface is responsible for the Ag$_2$Se seeding layer being smooth and relatively free of pinholes.

After the formation of the seeding layer, the OH$^-$ ions in the bath must diffuse through the Ag$_2$Se seeding layer to reach the surface of the glass in order to dissolve Ge$_x$Se$_{1-x}$ and thus form more Ag$_2$Se. Therefore, the rate of growth of additional Ag$_2$Se is dependent on the diffusion rate of OH$^-$ ions through the thickness of the Ag$_2$Se. During this diffusion process, it is believed that the hydrophilic moiety of the ligand, e.g., the amino groups of ethylenediamine, form weak chemical bonds with the surface of the Ag$_2$Se, which is also hydrophilic. Thus, the hydrophobic moiety of the ligand is exposed to the bath. Consequently, an adsorbed, hydrophobic layer is formed on the surface of the Ag$_2$Se. It is believed that the resulting ionic mismatch between the adsorbed, hydrophobic layer and the bath tends to retard the formation of Ag$_2$Se, allowing the dissolution of Ag$_2$SeO$_3$ before the precipitation of the Ag$_2$Se. Thus, the hydrophobic-hydrophilic ligands employed in the invention initially operate to reduce the ionic mismatch between the bath and the surface of the chalcogenide glass, and subsequently operate to produce an ionic mismatch between the surface of the Ag$_2$Se and the bath. Consequently, a smooth, pinhole-free seeding layer is initially formed, and the subsequent rate of formation of the Ag$_2$Se is retarded relative to that of the Ag$_2$SeO$_3$, avoiding the formation of pinholes.

Because the ligands employed in the inventive bath prevent the formation of pinholes, the rate of growth of the Ag$_2$Se layer is diffusion limited, i.e., is limited by the diffusion rate of the OH$^-$ ions through the (substantially pinhole-free) Ag$_2$Se. Thus, initially, the Ag$_2$Se layer grows relatively quickly because OH$^-$ ions quickly diffuse through the thin seeding layer. Thereafter, the rate of growth of the Ag$_2$Se decreases as the thickness of the Ag$_2$Se increases, quickly reaching the point where there is little or no further growth because relatively few OH$^-$ ions diffuse through the relatively thick layer of Ag$_2$Se.

The ultimate thickness of the Ag$_2$Se layer is largely determined by the concentration of OH$^-$ ions in the bath, i.e., the pH of the bath. That is, for a given initial thickness of Ag$_2$Se, the concentration of OH$^-$ ions in the bath largely determines the number of OH$^-$ ions which diffuse through to the Ge$_x$Se$_{1-x}$/Ag$_2$Se interface to dissolve Ge$_x$Se$_{1-x}$ and thus form more Ag$_2$Se. The higher the OH$^-$ concentration, the more Ge$_x$Se$_{1-x}$ which is dissolved and the more Ag$_2$Se which is formed, and thus the greater the ultimate thickness of the final Ag$_2$Se layer.

It is the diffusion-limited nature of the bath which, it is believed, accounts for the fact that after a minimum dip time (of at least 1 minute, and preferably at least 5 minutes) the thickness of the silver composition-containing layer is relatively insensitive to dip time and determined primarily by the pH of the bath.

Because the rate of growth of the Ag$_2$Se layer is a function of the thickness of the Ag$_2$Se layer, initially relatively thin portions of the Ag$_2$Se layer grow faster than relatively thick portions. Consequently, the relatively thin portions of the Ag$_2$Se layer eventually catch up to the relatively thick portions, resulting in a Ag$_2$Se layer having a substantially uniform thickness.

It must be emphasized that the above-described operation of the inventive bath is only an hypothesis, and that the utility of the inventive sensitizing bath is in no way dependent on the validity of this hypothesis.

While not essential to the invention, the inventive aqueous sensitizing bath also includes an organic solvent which is water miscible (water miscible, for purposes of the invention, means that water and the organic solvent mix when the proportion of the latter to the former is at least 1:1). Such organic solvents are advantageous because they dissolve ligands and silver complexes not soluble just in water. Useful organic solvents include, for example, methanol and isopropyl alcohol. The bath should be comprised of no more than about 90 percent (by volume) of the organic solvent, and preferably about 50 percent. Baths containing more than about 90 percent of the solvent are undesirable because they produce precipitates which result in defects in the silver composition-containing films.

While the inventive bath, described above, is stable over periods of time of at least one day (no visually observable silver-containing compounds precipitate out of solution over periods of at least one day), the stability of the bath is significantly increased (to periods of at least one week) by the addition to the bath of pyrophosphate salts and oxalate salts soluble in the bath. Included among the useful pyrophosphate and oxalate salts are, for example, sodium pyrophosphate, potassium pyrophosphate, sodium oxalate, and potassium oxalate. The concentration of these stability-enhancing salts in the bath should range from about 0.001M to about the saturation limit for the particular salt being used. Concentrations less than about 0.001M are undesirable because they are ineffective to increase stability. At concentrations greater than the saturation concentration, these salts precipitate out of solution, and often cause defects in the silver composition-containing layer.

After the formation of the silver composition-containing layer on the surface of the chalcogenide glass, a device is formed, in accordance with the invention, by the conventional steps of exposing the chalcogenide glass to energy (resulting in the silver photodoping of the chalcogenide glass), stripping excess silver composition-containing material from the surface of the chalcogenide glass, and then either dry or wet developing the chalcogenide glass in order to delineate a pattern within the glass. Thereafter, the pattern delineated in the chalcogenide glass is transferred to the underlying substrate by, for example, the conventional steps of etching or metallizing the substrate through the patterned chalcogenide glass.

EXAMPLE 1

The following demonstrates the dip-time insensitivity of the inventive sensitizing bath.

A film of Ge$_{0.15}$Se$_{0.85}$ was e-beam evaporated onto each of three, 3-inch silicon wafers. The thickness of each film was measured by dissolving all of the film off a portion of each wafer, thus creating a step whose height was measured with a profilometer. The thickness of the Ge$_{0.15}$Se$_{0.85}$ film (the step height) was found, in each case, to be about 2000 Å.

A sensitizing bath for the germanium-selenium films was prepared by dissolving 245.5 grams of AgNO$_3$ in 14 liters of water, adding 401 ml of (99 percent pure) ethylenediamine (ED), and finally dissolving 334.5 grams of sodium pyrophosphate in the solution. The sensitizing bath contained 0.1M of Ag(ED)$^+$ and exhibited a pH of 11.61 (as measured with an ORION combination electrode and (Model 611) pH meter).

The first of the three Ge$_{0.15}$Se$_{0.85}$-covered wafers was then dipped into the sensitizing bath for one minute, the second wafer was dipped into the bath for five minutes, and the third wafer was dipped into the bath for ten minutes. The bath was maintained at 19° C. throughout these dipping procedures. After removal from the bath, each wafer was rinsed in deionized water and spin dried. Using conventional X-ray fluorescence techniques, the thickness of the Ag$_2$Se layer formed on the first wafer was measured to be 69 Å. The thicknesses of the Ag$_2$Se layers formed on the second and third wafers were similarly measured to be, respectively, 73 Å and 74 Å. Thus, a factor of 10 difference in dip time (between the first and third wafers) yielded an increase in Ag$_2$Se thickness (thickness increased from 69 Å to 74 Å) of only 7 percent.

Conventional X-ray fluorescence techniques were also used to measure the thickness variations of the Ag$_2$Se layers formed on the second and third wafers. These were found to be less than 5 percent of the average thickness, in each case.

EXAMPLE 2

The following demonstrates the dependence of Ag$_2$Se thickness on the pH of the inventive sensitizing bath. p A film of Ge$_{0.15}$Se$_{0.85}$ was e-beam evaporated onto each of six, 3-inch silicon wafers. The thickness of each of the films was measured, as in Example 1, and found to be about 1800 Å.

Each of three sensitizing baths was prepared by dissolving 16.98 grams of AgNO$_3$, dried at 110° C. for about one hour, and 22.5 grams of $\beta$-alanine, in water to form a one-kiter solution. The pH of the first sensitizing bath was measured to be 6.33 (the pH of the bath was measured with an ORION combination electrode and a (Model 611) pH meter). Concentrated KOH (6M) was then added, dropwise, to the second and third sensitizing baths until the pHs of these baths had been adjusted and measured (with the ORION combination electrode and a (Model 611) pH meter) to be, respectively, 9.15 and 12.03.

Three of the Ge$_{0.15}$Se$_{0.85}$-covered wafers were then chosen at random, and each of the three wafers was then dipped into a different one of the three sensitizing baths for five minutes. The temperatures of the three sensitizing baths, during these dipping procedures, were maintained at 23° C. The thicknesses of the resulting Ag$_2$Se layers formed on the three wafers were measured using conventional X-ray fluorescence techniques, and found to have the values listed in the following table.

| Bath pH | Dip Time | Ag$_2$Se Thickness |
|---|---|---|
| 6.33 | 5 mins. | 35 Angstroms |
| 9.15 | 5 mins. | 48 Angstroms |
| 12.03 | 5 mins. | 70 Angstroms |

Each of the three remaining wafers was then dipped into a different one of the three sensitizing baths for 10 minutes. The thicknesses of the resulting Ag$_2$Se layers formed on these three wafers were measured, as described above, and found to have the values listed in the following table.

| Bath pH | Dip Time | Ag$_2$Se Thickness |
|---|---|---|
| 6.33 | 10 mins. | 38 Angstroms |
| 9.15 | 10 mins. | 50 Angstroms |
| 12.03 | 10 mins. | 73 Angstroms |

The above results indicate that it is the pH of the inventive sensitizing bath, and not the dip time, which largely determines the thickness of the Ag$_2$Se layer. In addition, a pH less than about 9.0 results in a Ag$_2$Se layer whose thickness is less than 50 Å.

EXAMPLE 3

The following also demonstrates the dependence of Ag$_2$Se thickness on the pH of the inventive sensitizing bath.

A film of Ge$_{0.15}$Se$_{0.85}$ was deposited, as in Example 1, onto each of three, three-inch silicon wafers. The thickness of each of the films was measured as in Example 1, and found to be about 1800 Å.

Each of three sensitizing baths was prepared by initially dissolving 16.98 grams of AgNO$_3$ in 200 ml (milliliters) of water. About 26.7 ml of ethylenediamine was then added, dropwise, to each of the three AgNO$_3$ solutions. Water was then added to each of the three baths to form a one-liter solution. The pH levels of the three baths were adjusted, as in Example 2, to be, respectively, 7.25, 9.90, and 11.80.

Each of the three Ge$_{0.15}$Se$_{0.85}$-covered wafers was then dipped into a different one of the three sensitizing baths for 5 minutes. The temperatures of the three sensitizing baths, during the dipping procedures, were maintained at 22° C. The thicknesses of the resulting Ag$_2$Se layers formed on the three wafers were measured as in Example 2, and found to have the values listed in the following table.

| Bath pH | Dip Time | Ag$_2$Se Thickness |
|---|---|---|
| 7.25 | 5 mins. | 38 Angstroms |
| 9.90 | 5 mins. | 54 Angstroms |
| 11.80 | 5 mins. | 73 Angstroms |

What is claimed is:

1. A method for fabricating a device, comprising the steps of:

forming a layer which includes a silver composition on a substrate-supported glass layer containing a chalcogenide element by immersing said glass layer in an aqueous sensitizing bath which includes a silver complex, exposing selected portions of said glass layer to energy, removing the residue of said silver composition-containing layer remaining on said glass layer, and treating said glass layer with a developing agent to delineate a pattern within the glass, Characterized In That said silver complex includes a ligand bound to a silver ion, the ligand including first and second moieties, the first moiety being hydrophobic and the second moiety being hydrophilic, both said ligand and said silver complex being soluble in said bath, and said bath has a pH ranging from about 9 to about 13.

2. The method of claim 1 wherein said ligand is multidentate.

3. The method of claim 1 wherein the concentration of said silver complex in said bath ranges from about 0.001 M to about 0.5 M.

4. The method of claim 1 wherein said chalcogenide element is selenium.

5. The method of claim 4 wherein the material of said glass layer has the composition Ge$_x$Se$_{1-x}$, where $x < \frac{1}{3}$.

6. The method of claim 1 wherein said ligand is ethylenediamine.

7. The method of claim 1 wherein said ligand is 1,2 propanediamine.

8. The method of claim 1 wherein said ligand is 1,3 propanediamine.

9. The method of claim 1 wherein said ligand is 1,4 butanediamine.

10. The method of claim 1 wherein said ligand is $\beta$-alanine.

11. The method of claim 1 wherein said ligand is glycine.

12. The method of claim 1 wherein said ligand is 2-aminomethylpyridine.

13. The method of claim 1 wherein said ligand is pyrrolidine-2,5 dione.

14. The method of claim 1 wherein said bath includes at least 50 percent water, by volume.

15. The method of claim 1 wherein said bath includes a water miscible organic solvent.

16. The method of claim 15 wherein said organic solvent is methanol.

17. The method of claim 15 wherein said organic solvent is isopropyl alcohol.

18. The method of claim 1 wherein said bath includes a pyrophosphate salt soluble in the bath.

19. The method of claim 18 wherein said pyrophosphate salt is sodium pyrophosphate.

20. The method of claim 18 wherein said pyrophosphate salt is potassium pyrophosphate.

21. The method of claim 1 wherein said bath includes an oxalate salt soluble in the bath.

22. The method of claim 21 wherein said oxalate salt is sodium oxalate.

23. The method of claim 21 wherein said oxalate salt is potassium oxalate.

* * * * *